US006880146B2

(12) United States Patent
Snider

(10) Patent No.: US 6,880,146 B2
(45) Date of Patent: Apr. 12, 2005

(54) MOLECULAR-WIRE-BASED RESTORATIVE MULTIPLEXER, AND METHOD FOR CONSTRUCTING A MULTIPLEXER BASED ON A CONFIGURABLE, MOLECULAR-JUNCTION-NANOWIRE CROSSBAR

(75) Inventor: Greg Snider, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 66 days.

(21) Appl. No.: 10/355,465

(22) Filed: Jan. 31, 2003

(65) Prior Publication Data

US 2004/0151211 A1 Aug. 5, 2004

(51) Int. Cl.[7] .............................................. G06F 17/50
(52) U.S. Cl. ................. 716/17; 716/1; 716/16
(58) Field of Search ............... 716/17, 16, 1, 716/9, 8, 10

(56) References Cited

U.S. PATENT DOCUMENTS

| | | | | |
|---|---|---|---|---|
| 6,128,214 A | * | 10/2000 | Kuekes et al. | 365/151 |
| 6,256,767 B1 | * | 7/2001 | Kuekes et al. | 716/9 |
| 6,518,156 B1 | * | 2/2003 | Chen et al. | 438/597 |
| 2004/0054978 A1 | * | 3/2004 | Hogg | 716/12 |

* cited by examiner

Primary Examiner—Vuthe Siek
Assistant Examiner—Sun James Lin

(57) ABSTRACT

A method for configuring any m-to-n multiplexer from a molecular-junction-nanowire crossbar, and m-to-n multiplexers configured according to the disclosed method. In the described embodiments, a complementary/symmetry molecular-junction-nanowire crossbar is employed, with input nanowire signal lines intersecting certain relatively high-voltage narrow nanowires via nFET devices and intersecting grounded nanowires via pFET devices. The relatively high-voltage and grounded nanowires are, in turn, selectively coupled to one or more output nanowire signal lines.

13 Claims, 11 Drawing Sheets

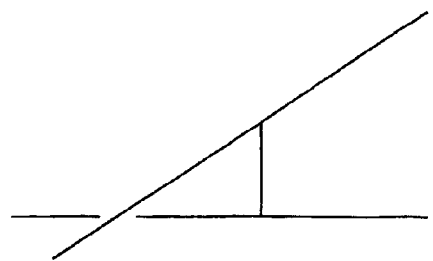
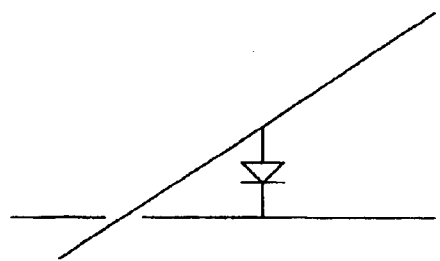
Figure 5A             Figure 5B
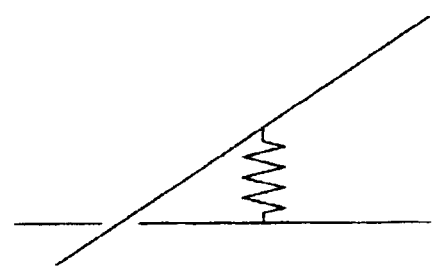
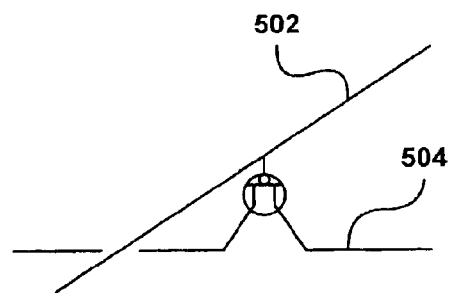
Figure 5C             Figure 5D
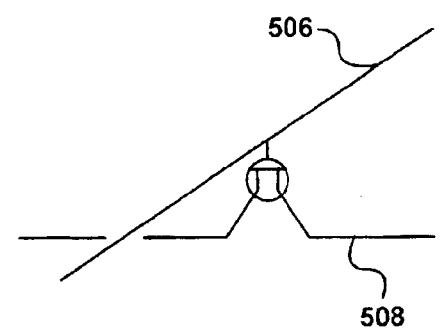
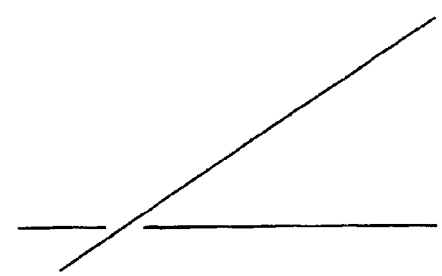
Figure 5E             Figure 5F

| address inputs | | inputs | out |
|---|---|---|---|
| $a_1$ | $a_2$ | | |
| 0 | 0 | $in_1, in_2, in_3$ | $\overline{in}_1$ |
| 0 | 1 | $in_1, in_2, in_3$ | $\overline{in}_2$ |
| 1 | 0 | $in_1, in_2, in_3$ | $\overline{in}_3$ |
| 1 | 1 | $in_1, in_2, in_3$ | high Z |

US 6,880,146 B2

MOLECULAR-WIRE-BASED RESTORATIVE MULTIPLEXER, AND METHOD FOR CONSTRUCTING A MULTIPLEXER BASED ON A CONFIGURABLE, MOLECULAR-JUNCTION-NANOWIRE CROSSBAR

TECHNICAL FIELD

The present invention relates to electronic multiplexers and, in particular, programmable, nanoscale-sized electronic multiplexers configured from molecular-junction-nanowire crossbars that may be integrated with additional components in extremely dense electrical subsystems.

BACKGROUND OF THE INVENTION

During the past fifty years, the electronics and computing industries have been relentlessly propelled forward by the ever decreasing sizes of basic electronic components, such as transistors and signal lines, and by the correspondingly ever increasing component densities of integrated circuits, including processors and electronic memory chips. Eventually, however, it is expected that fundamental component-size limits will be reached in semiconductor-circuit-fabrication technologies based on photolithographic methods. As the size of components decreases below the resolution limit of ultraviolet light, for example, far more technically demanding and expensive higher-energy-radiation-based technologies need to be employed to create smaller components using photolithographic techniques. Not only must expensive semiconductor fabrication facilities be rebuilt in order to use the new techniques, many new obstacles are expected to be encountered. For example, it is necessary to construct semiconductor devices through a series of photolithographic steps, with precise alignment of the masks used in each step with respect to the components already fabricated on the surface of a nascent semiconductor. As the component sizes decrease, precise alignment becomes more and more difficult and expensive. As another example, the probabilities that certain types of randomly distributed defects in semiconductor surfaces result in defective semiconductor devices may increase as the sizes of components manufactured on the semiconductor services decrease, resulting in an increasing proportion of defective devices during manufacture, and a correspondingly lower yield of useful product. Ultimately, various quantum effects that arise only at molecular-scale distances may altogether overwhelm current approaches to component construction in semiconductors.

In view of these problems, researchers and developers have expended considerable research effort in fabricating microscale and nanoscale electronic devices using alternative technologies, where nanoscale electronic devices generally employ nanoscale signal lines having widths, and nanoscale components having dimensions, of less than 100 nanometers. More densely fabricated nanoscale electronic devices may employ nanoscale signal lines having widths, and nanoscale components having dimensions, of less than 50 nanometers.

Although general nanowire technologies have been developed, it is not necessarily straightforward to employ nanowire technologies to miniaturize existing types of circuits and structures. While it may be possible to tediously construct miniaturized, nanowire circuits similar to the much larger, current circuits, it is impractical, and often impossible, to manufacture such miniaturized circuits. Even were such straightforwardly miniaturized circuits able to feasibly manufactured, the much higher component densities that ensue from combining together nanoscale components necessitate much different strategies related to removing waste heat produced by the circuits. In addition, the electronic properties of substances may change dramatically at nanoscale dimensions, so that different types of approaches and substances may need to be employed for fabricating even relatively simple, well-known circuits and subsystems at nanoscale dimensions. Thus, new implementation strategies and techniques need to be employed to develop and manufacture useful circuits and structures at nanoscale dimensions using nanowires.

One type of useful circuit that would be desirable to produce at nanoscale dimensions is a signal multiplexer. One type of signal multiplexer is used to output a selected one of many input signals under the control of address lines. FIGS. 1A–B illustrate a 4-input-line-to-1-output-line, or 4-to-1, multiplexer. As shown in FIG. 1A, the 4-to-1 multiplexer 101 receives four molecular input-signal lines "$in_1$," "$in_2$," "$in_3$," and "$in_4$" 602–605, each of which can be in a high voltage, or ON, state, or a low-voltage, or OFF, state. In general, an ON state is designated as "1," while an OFF state is designated as "0." The 4-to-1 multiplexer 601 outputs a single molecular output-signal line 106. The 4-to-1 multiplexer, in addition, receives four input address lines "$a_1$," "$\bar{a}_1$," "$a_2$," and "$\bar{a}_2$" 108–111 which correspond to two address bits "$a_1$" and "$a_2$." Thus, in other words, the 4-to-1 multiplexer receives two address bits, each address bit redundantly encoded in an address-bit signal line and its complement signal line. FIG. 1B shows a truth table indicating how the values of the two address inputs "$a_1$" and "$a_2$" determine the state of the molecular output-signal line by the 4-to-1 multiplexer shown in FIG. 1A. The two address inputs "$a_1$" and "$a_2$," each comprising a pair of signal lines, as discussed above, serve as a 2-bit, 4-value address, each address selecting one of the four input lines "$in_1$," "$in_2$," "$in_3$," and "$in_4$". As shown in FIG. 1B, the $a_1/a_2$ input value "00" selects output by the 4-to-1 multiplexer of the value currently input on input line "$in_1$." Similarly, the address values "01," "10," and "11," select output of the current value of inputs "$in_1$," "$in_2$," "$in_3$," and "$in_4$," respectively. Thus, the 4-to-1 multiplexer outputs the state of one of four input lines selected by a two-bit, four-value input address.

Multiplexers find frequent use in electronic circuits. Designers and manufacturers of nanoscale electronic devices, including molecular-wire lattices, have recognized the need for implementing multiplexers at the nanoscale level. Unfortunately, the current methods by which multiplexers are fabricated are not amenable to simple miniaturization using nanowire-based structures similar to those currently employed at larger dimensions. Instead, designers, manufacturers, and users of devices that include multiplexers have recognized the need for new methods for implementing multiplexers that are useable at nanoscale dimensions. Moreover, to facilitate reuse and flexibility of multiplexer components, designers, manufacturers, and users of devices that include multiplexers have recognized the need for reprogrammable multiplexers that can be reconfigured for alternative uses or to enhance the devices in which they are included.

SUMMARY OF THE INVENTION

Four n-to-1 multiplexers, where n=2, 3, 4, and 5, are provided as four exemplary embodiments of the present invention. More generally, the present invention provides an approach to configuring an arbitrary m-to-n multiplexer from a molecular-junction-nanowire crossbar. In the described embodiments, a complementary/symmetry lattice is employed, with input nanoscale signal lines intersecting certain relatively high-voltage nanowires via nFET devices and intersecting grounded nanowires via pFET devices. The relatively high-voltage nanowires and grounded nanowires are, in turn, selectively coupled to one or more molecular output-signal lines. Thus, any general m-to-n multiplexer can be configured from a sufficiently large complementary/symmetry lattice.

Molecular-junction-nanowire crossbar implementations of multiplexers consume very little power, and have extremely high densities. These extremely dense multiplexers can then be combined into extremely dense subsystems that include many additional electrical components, implemented within a set of complementary/symmetry ("CS") lattices. Thus, rather than simply representing a miniaturization of existing multiplexer circuits, in isolation, the present invention provides for building multiplexers into complex subsystems having transistor densities equal to, or greater than, 1 billion transistors/$cm^2$, or, in other words, having 1.0 giga-transistor/$cm^2$ densities and greater transistor densities.

BRIEF DESCRIPTION OF THE DRAWINGS

FIG. 5 schematically illustrates a number of simple electrical components that can be programmed at the junctions of nanowires in molecular-junction-nanowire crossbars.

DETAILED DESCRIPTION OF THE INVENTION

As discussed below, molecular-junction-nanowire crossbars represent one of a number of emerging nanoscale electronic-circuit media that can be used to construct nanoscale electronic circuits. Various techniques have been developed to selectively configure different types of simple electronic components, such as transistors, resistors, diodes, and connections, at the junctions between conductive paths of two different layers of a molecular-junction-nanowire crossbar. The present invention provides a method for configuring m-to-n input-to-output multiplexers from molecular-junction-nanowire crossbars and, in particular, from complementary/symmetry lattices ("CS lattices"). In a first subsection, below, molecular-junction-nanowire crossbars are described. In a second subsection, a number of embodiments of the present invention that employ molecular-junction-nanowire-crossbar technology are described.

Molecular-Junction-Nanowire Crossbars

Figure 1:
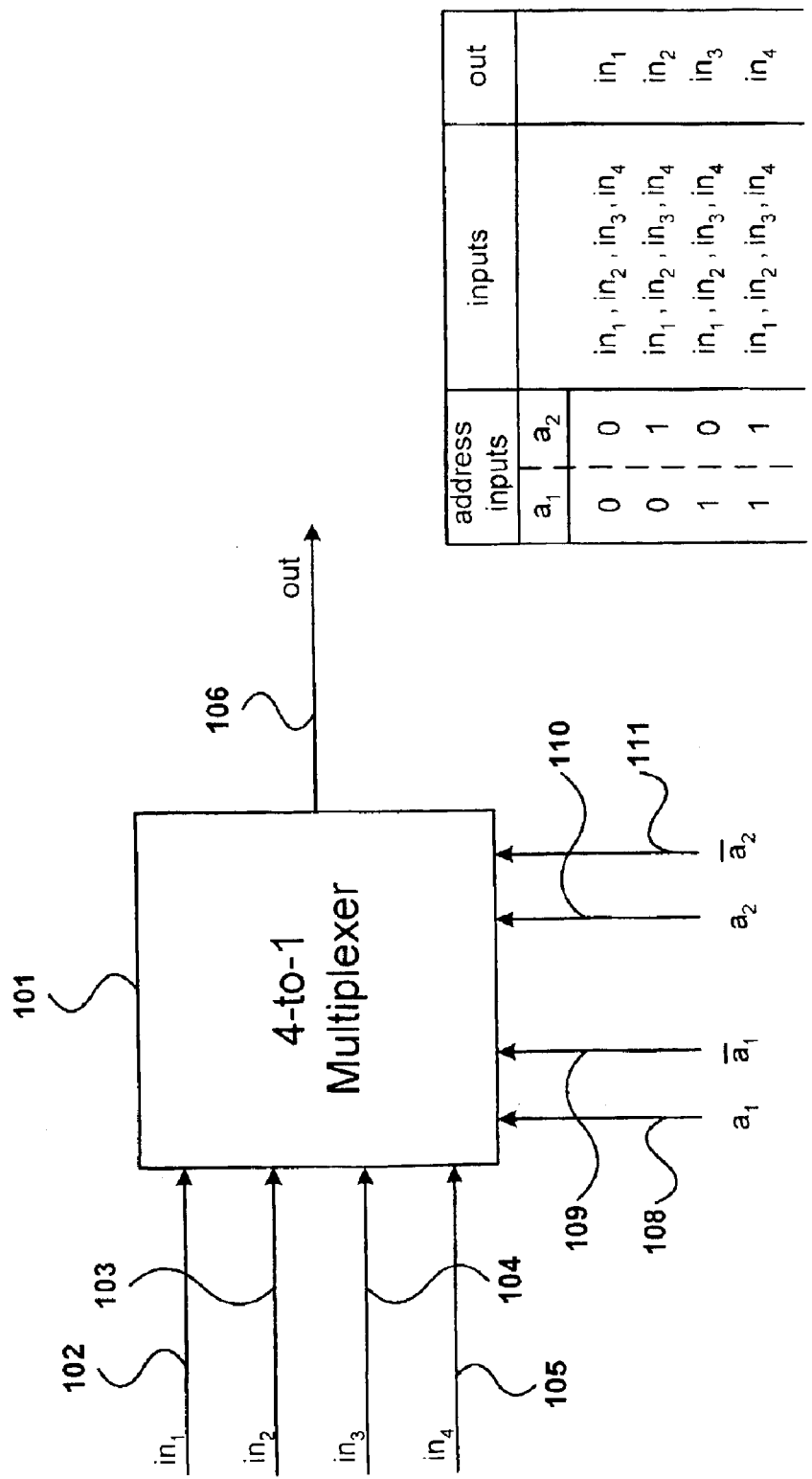
FIGS. 1A–B illustrate a 4-input-line-to-1-output-line multiplexer.
Figure 2:
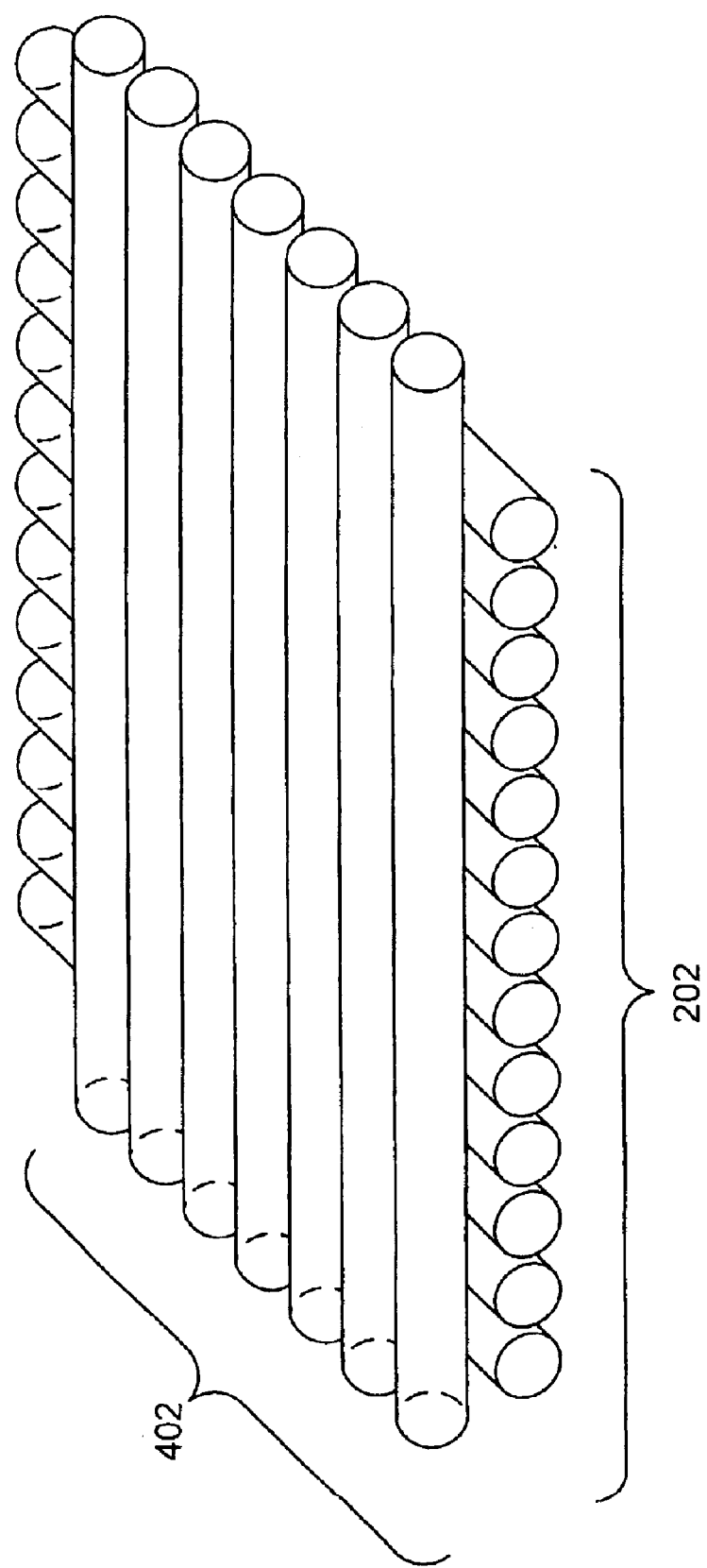
FIG. 2 illustrates a basic molecular-junction-nanowire crossbar.

A relatively new and promising alternative technology involves molecular-junction-nanowire crossbars. FIG. 2 illustrates a molecular-junction-nanowire crossbar. In FIG. 2, a first layer of approximately parallel nanowires 202 is overlain by a second layer of approximately parallel nanowires 204 roughly perpendicular, in orientation, to the nanowires of the first layer 202, although the orientation angle between the layers may vary. The two layers of nanowires form a lattice, or crossbar, each nanowire of the second layer 204 overlying all of the nanowires of the first layer 202 and coming into close contact with each nanowire of the first layer 202 at intersection points, or junctions that represent the closest contact between two nanowires.

Nanowires can be fabricated using mechanical nanoprinting techniques. Alternatively, nanowires can be chemically synthesized and can be deposited as layers of nanowires in one or a few process steps. Other alternative techniques for fabricating nanowires may also be employed. Thus, a two-dimensional molecular-junction-nanowire crossbar comprising first and second layers, as shown in FIG. 2, can be manufactured via a relatively straightforward process. Many different types of conductive and semi-conductive nanowires can be chemically synthesized from metallic and semiconductor substances, from combinations of these types of substances, and from other types of substances. A molecular-junction-nanowire crossbar may be connected to microscale signal-line leads or other electronic leads through a variety of different methods to incorporate the nanowires into electrical circuits.

Figure 3:
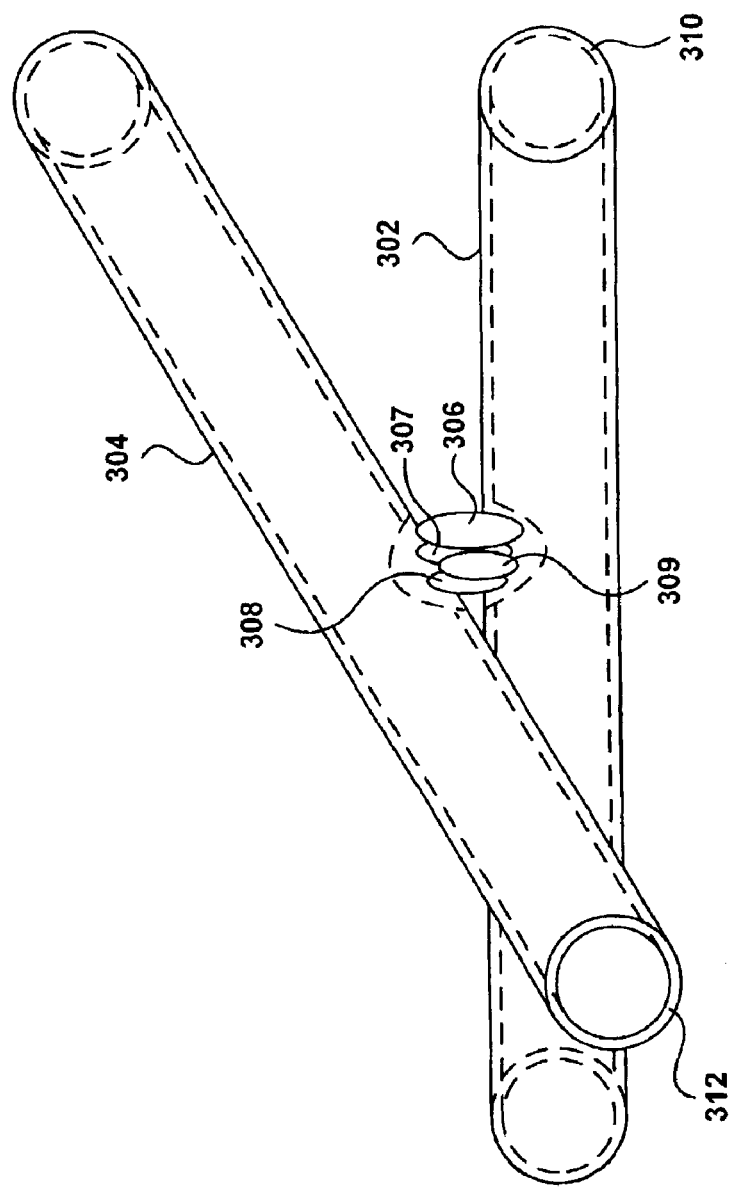
FIG. 3 illustrates a junction, or intersection, between two nanowires.
Figure 4A:
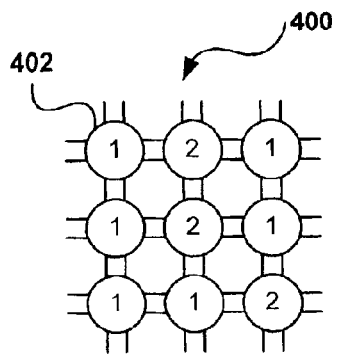
FIG. 4 illustrates one possible approach for configuring a network of nanoscale electrical components from a two-dimensional molecular-junction-nanowire crossbar.
Figure 4B:
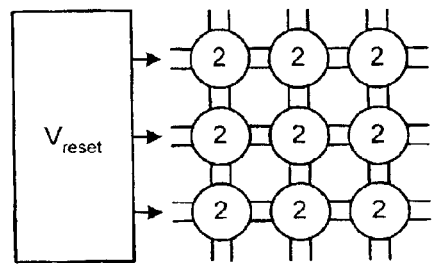
Figure 4C:
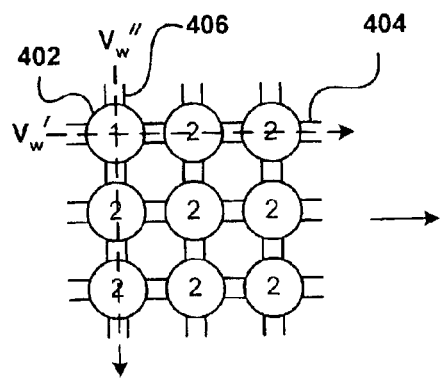
Figure 4D:
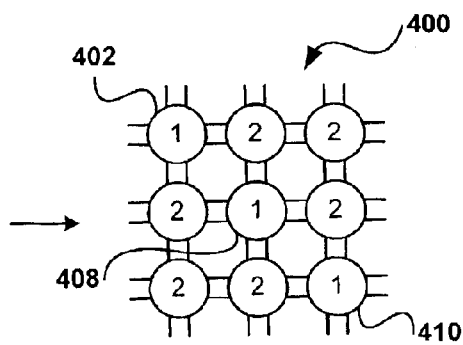
Figure 4E:
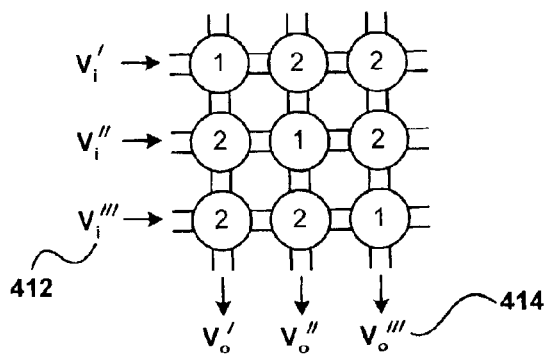

Molecular-junction-nanowire crossbars are not only layers of parallel conductive elements but may also be used to create arrays of nanoscale electronic components, such as transistors, diodes, resistors, and other familiar basic electronic components. FIG. 3 illustrates a junction between nanowires of two contiguous layers within a molecular-junction-nanowire crossbar. In FIG. 3, the junction between a first nanowire 302 of a first nanowire layer intersects a second nanowire 304 of a second nanowire layer. Note that the junction may or may not involve physical contact between the two nanowires 302 and 304. As shown in FIG. 3, the two nanowires are not in physical contact at their closest point of approach, but the gap between them is spanned by a small number of molecules 306–309. Various different types of molecules may be introduced at junctions for a variety of different purposes. In many cases, the molecules of a junction may be accessed, for various purposes, through different voltage levels or current levels placed on the nanowires forming the junction. The molecules spanning the junction in FIG. 3 may have various different quantum states in which the molecules exhibit resistive, semiconductor-like, or conductive electrical properties. The current passing between the two nanowires intersecting at a junction may be a nonlinear function of the voltage across the junction as a result of quantum-mechanical tunneling of electrons through relatively low-energy, unoccupied quantum states of the molecules. The quantum states, and relative energies of quantum states, of the molecules may be controlled by applying differential currents or voltages to the nanowires forming the interaction. For example, molecules may be conductive in a reduced state, but may act as insulators in an oxidized state, with redox reactions controlled by voltage levels determining which of the quantum states the molecules inhabit.

In general, a molecular junction is anisotropic, having a polarity or direction with respect to physical properties, including electrical properties. This anisotropy may arise from different chemical and/or physical properties of nanowires in the two layers of a molecular-junction-nanowire crossbar, may arise from asymmetries of junction molecules combined with junction molecules being uniformly oriented with respect to the nanowire layers, and may arise both from differences in the properties of the nanowires as well as junction-molecule asymmetries. The fact the molecular junctions may have polarities allows for controlling junction properties by applying positive and negative voltages to molecular junctions, eliciting forward and reverse currents within the molecular junctions.

As shown in FIG. 3, the nanowires may include outer coatings, such as outer coatings 310 and 312. The outer coatings may serve to insulate nanowires from one another, may constitute the molecules that serve to span junctions when the nanowires are placed in contact with one another, or may serve as modulation-dopant-layers, which can be selectively activated to dope semiconductor nanowires. Both p-type and n-type modulation dopant coatings have been developed. In other applications, the molecules spanning junctions between crossing nanowires may be introduced as a separate layer formed between layers of nanowires. In some cases, the state changes of junction molecules may not be reversible. For example, the junction molecules may initially be resistive, and may be made conductive through application of relatively high voltages. In other cases, the junction molecules may be conductive, but the molecules may be irreversibly damaged, along with portions of the nanowires proximal to the junctions, through application of very high voltage levels, resulting in disrupting conductivity between the two nanowires and breaking electrical connection between them. In yet other cases, the junction molecules may transition reversibly from one state to another and back, so that the nanoscale electrical components configured at nanowire junctions may be reconfigured, or programmed, by application of differential voltages to selected nanowire junctions.

FIG. 4 illustrates one possible approach to configuring a network of reconfigurable nanoscale electrical components from a two-dimensional molecular-junction-nanowire crossbar. In FIGS. 4A–E, a small 3×3 molecular-junction-nanowire crossbar is shown, with circles at all nine junctions to indicate the state of the junction molecules. In one state, labeled "1" in FIGS. 4A–E, the junction molecules may have certain semiconductor, or conductive properties, while in a second state, labeled "2" in FIGS. 4A–E, junction molecules may have different properties. Initially, as shown in FIG. 4A, the states of the junctions of the molecular-junction-nanowire crossbar 400 are indeterminate. In other words, as shown in FIG. 4A, the states of the junctions, such as junction 402, are randomly distributed between state "1" and state "2." Next, as shown in FIG. 4B, a reset voltage "$v_{reset}$," often either a relatively large positive or negative voltage, is applied to all junctions in order to uniformly set the states of all junctions to a particular state, in the case shown in FIG. 4B, state "2." Next, as shown in FIG. 4C, each junction may be uniquely accessed by applying a write voltage, or configuring voltage, to the nanowires that form the junction in order to configure, or program, the junction to have the state "1." For example, in FIG. 4C, a first write voltage $v_w'$ is applied to horizontal nanowire 404 and a second write voltage $v_w''$ is applied to vertical nanowire 406 to change the state of the junction from "2" to "1." Individual junctions may be configured through steps similar to the steps shown in FIG. 4C to finally result in a fully configured nanoscale component network as shown in FIG. 4D. Note that, in FIG. 4D, the states of junctions 402, 408, and 410 that form a downward-slanted diagonal through the molecular-junction-nanowire crossbar have been configured by selective application of write voltages. Finally, as shown in FIG. 4E, the nanoscale electrical component network can be used as a portion of an integrated circuit. Input voltages $v_i'$, $v_i''$, and $v_i'''$ may be applied to the nanoscale electrical component lattice as inputs 412 and output voltages $v_o'$, $v_o''$, and $v_o'''$ 414 may be accessed as the result of operation of the nanoscale electrical component network that represents a portion of an integrated circuit. In general, the input and output voltages $v_i'$, $v_i''$, and $v_i'''$ and $v_o'$, $v_o''$, and $v_o'''$ have relatively low magnitudes compared with the write voltages $v_w$ and the reset voltages $v_{reset}$. Should the integrated circuit need to be reconfigured, the reset voltage $v_{reset}$ may be again applied to the molecular-junction-nanowire crossbar, as in FIG. 4B, and the device reconfigured, or reprogrammed, as shown in steps in FIGS. 4C–D. Depending on the types of nanowires, types of dopants employed in the case of semiconductor nanowires, and the types of junction molecules employed in the molecular-junction-nanowire crossbar, many different, but similar configuring processes may be used to configure molecular-junction-nanowire crossbars into nanowire-based electrical components networks. The example of FIG. 4 is meant to illustrate a general process by which molecular-junction-nanowire crossbars may be configured as useful portions of electronic circuits.

Junctions of nanowires in molecular-junction-nanowire crossbars may be configured, in various techniques depending on the chemical nature of the nanowires and junction-spanning molecules, to form a wide variety of different, simple electronic devices. FIG. 5 schematically illustrates a number of simple electrical components that can be configured at the junctions of nanowires in molecular-junction-nanowire crossbars. A junction may represent (1) a simple conductive connection between the two nanowires, as shown in FIG. 5A; (2) a diode that conducts current in only one direction between the two nanowires, as shown in FIG. 5B; (3) a resistor, with the magnitude of resistance configurable by application of different configuring voltages, as shown in FIG. 5C; (4) a negatively doped field-effect transistor ("nFET"), as shown in FIG. 5D; (5) a positively doped field-effect transistor ("pFET"), as shown in FIG. 5E; and (6) the crossing of two conductive nanowires, with the voltage and current associated with each nanowire completely independent from one another, as shown in FIG. 5F. In the case of the nFET, shown in FIG. 5D, a relatively low voltage state on the gate wire 502 results in current passing through the source/drain wire 504, while a relatively high voltage on the gate wire 502 prevents conduction of current on the source/drain nanowire 504. The pFET of FIG. 5E exhibits opposite behavior, with high voltage on the gate wire 506 facilitating flow of current through the source/drain wire 508, and low voltage on the gate wire 506 preventing flow of current on the source/drain wire 508. Note also that a junction may also be configured as an insulator, essentially interrupting conduction at the junction with respect to both nanowires. Thus, as discussed above with reference to FIGS. 2–5, a two-dimensional molecular-junction-nanowire crossbar may be constructed and then configured as a network of electrical components. Note also that a junction, although shown in FIGS. 5A–F to comprise the junction of two single nanowires, may also comprise a number of junctions between a number of wires in a first layer of a molecular-junction-nanowire crossbar that together comprise a single conductive element and the nanowires in a second nanowire layer that together comprise a second conductive element.

The configurable electrical resistance of molecular junctions is an important and special property of molecular junctions. When certain types of molecules are used for molecular junctions, the initially relatively high resistance of the molecular junction may be lowered by applying a relatively large positive voltage to the molecular junction. The resistance of the molecular junction is generally a function of the magnitude of the highest voltage applied to the junction. By applying higher and higher positive voltages to a junction, the resistance of the junction can be made lower and lower. A relatively low resistance state achieved by application of a positive voltage may be reversed by applying a sufficiently high, negative voltage. Thus, not only is the electrical resistance of a molecular junction configurable, the electrical resistance may also be reconfigurable, depending on the type of molecules forming the molecular junction.

Figure 6:
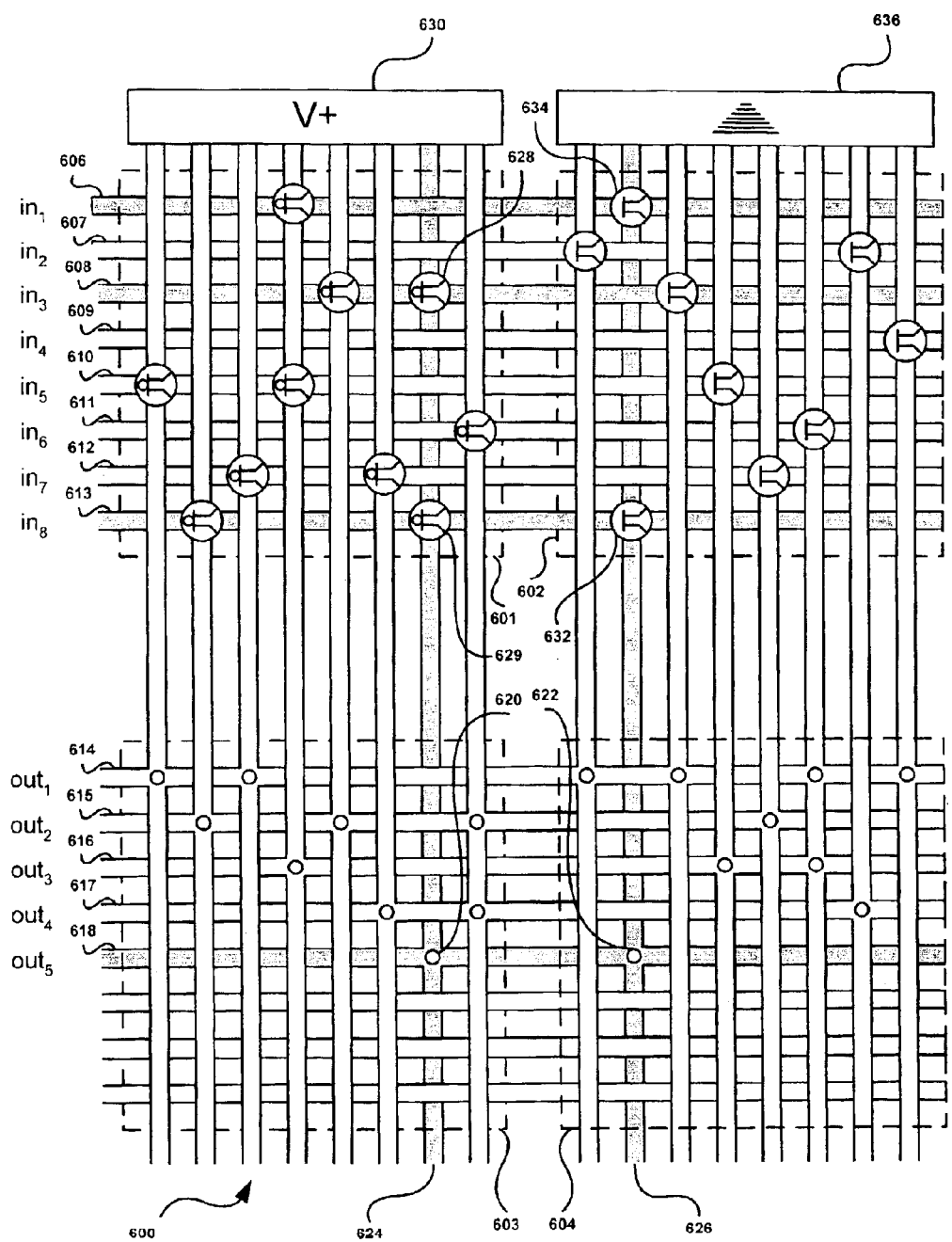
FIG. 6 illustrates an exemplary CS lattice.

A particularly useful type of nanoscale electronic component array based on molecular-junction-nanowire-crossbar technology is referred to as a "complementary/symmetry lattice" ("CS lattice"). FIG. 6 illustrates an exemplary CS lattice. Note that, although CS lattices are generally configured to represent logical and useful circuits, the CS lattice in FIG. 6 is rather arbitrarily configured, and is shown not as a representation of a particular subcircuit implemented by the CS lattice, and may not even be useful or functional, but rather is included to show the basic features of the CS lattice itself. In general, because of the small scales of the molecular-junction-nanowire-crossbar grids, it is difficult to chemically alter individual junctions. Techniques do exist for applying a very small number of molecules to a particular junction, but the techniques are painstakingly time consuming, and unsuitable for mass production. However, it is currently relatively straightforward to chemically alter subregions or microregions, comprising a number of junctions using currently available semiconductor manufacturing technologies. The term "microregion" is meant to indicate a scale larger than an individual molecular junction, but not necessarily a particular range of dimensions. It is current technically feasible to fabricate sub-micron-sized microregions, for example. In the exemplary CS lattice shown in FIG. 6, four distinct, square microregions, demarcated by dashed lines 601–604, are shown within the molecular-junction-nanowire crossbar 600. Microregion 601 is chemically altered so that junctions within microregion 601 may be selectively configured as nFET components. Conversely, microregion 602 has been chemically altered so that junctions within subregion 602 may be selectively configured as pFET components. The microregions 603 and 604 have been chemically configured so that junctions within microregions 603 and 604 can be selectively configured as conductive links that electrically connect the nanowires forming the junctions. In certain embodiments, one set of parallel wires, the horizontal, conductive nanowires in FIG. 6, may be of nanoscale dimensions or of greater, sub-mircoscale or microscale dimensions, while the other set of parallel wires, the vertical semiconductive nanowires in FIG. 6, need to be of nanoscale dimensions in order for a CS-lattice-based circuit to properly function.

In a CS lattice, some number of nanowires is considered as a set of molecular input-signal lines. For example, in the CS lattice shown in FIG. 6, horizontal nanowires 606–613 are considered as inputs, and labeled "$in_1$"–"$in_8$". Similarly, a distinct set of wires is normally considered as a set of molecular output-signal lines. For example, in the CS lattice shown in FIG. 6, horizontal nanowires 614–618 are considered as molecular output-signal lines, and designated in FIG. 6 as "$out_1$"–"$out_5$." Consider, for example, molecular output-signal line, or horizontal nanowire, "$out_5$" 618. Proceeding along nanowire "$out_5$" 618 from left to right, it can be seen that molecular output-signal line "$out_5$" is connected via junction connections 620 and 622, denoted by small circles in the junctions, to vertical nanowires 624 and 626, respectively. Traversing these vertical nanowires 624 and 626, it can be seen that vertical wire 624 is connected with molecular input-signal line "$in_3$" 608 via an nFET 628 and connected with molecular input-signal line "ins" 613 via an nFET 629. Thus, when molecular input-signal lines "$in_3$" 608 and "$in_5$" 613 are low, the nFETs 628 and 629 are activated to connect molecular output-signal line "$out_5$" with a high voltage source 630, potentially driving molecular output-signal line "$out^5$" to a high-voltage state. However, following vertical nanowire 626 upwards from the connection 622 to molecular output-signal line "$out_5$" 618, it can be seen that the vertical nanowire 626 interconnects with molecular input-signal line "$in_8$" 613 via a pFET 632 and interconnects with molecular input-signal line "$in_1$" 606 via a pFET 634. Whenever molecular input-signal lines "$in_1$" and "$in_8$" are both in a high-voltage, or ON, state, then the pFETs 632 and 634 are activated to interconnect the vertical nanowire 626 with ground 636, essentially shorting vertical nanowire 626 and molecular output-signal line "$out_5$" 618 to ground. When molecular input-signal lines "$in_1$" and "$in_8$" are high, or ON, molecular output-signal line "$out_5$" 618 is low, or OFF. When both of molecular input-signal lines "$in_1$" and "$in_8$" are not high, or ON, and both molecular input-signal lines "$in_3$" and "$in_5$" are not low, or OFF, then molecular output-signal line "$out_5$" is undriven, and in a high impedance state. Thus, the state of molecular output-signal line "$out_5$" 618 depends only on the states of molecular input-signal lines "$in_1$," "$in_3$," and "$in_8$," and a truth table summarizing the response of molecular output-signal line to all possible input-signal-line-states can be provided as follows:

| $in_1$ | $in_3$ | $in_8$ | $out_5$ |
| --- | --- | --- | --- |
| 0 | 0 | 0 | 1 |
| 0 | 0 | 1 | 1 |
| 0 | 1 | 0 | high Z |
| 0 | 1 | 1 | high Z |
| 1 | 0 | 0 | 1 |
| 1 | 0 | 1 | 0 |
| 1 | 1 | 0 | high Z |
| 1 | 1 | 1 | 0 |

Various different types and sizes of CS lattices are possible. The configuration of CS lattices is constrained only by the fact that there is a minimum area of a molecular-junction-nanowire crossbar to which discrete types of chemically modifying agents can be applied, by direct deposit, by photolithographic methods, or by other methods. Thus, CS lattices comprise blocks of sublattices, or microregions, within which one or a small number of different types of nanoscale electrical components can be selectively created at nanowire junctions.

While a brief introduction to nanowire lattices has been provided, above, more detailed information is available in a number of patent applications and issued patents. Additional information may be obtained from: Kuekes, et al., U.S. Pat. No. 6,314,019B1; Kuekes et al., U.S. Pat. No. 6,256,767B1; Kuekes, et al., U.S. Pat. No. 6,128,214; and Snider, et al., U.S. patent application Ser. No. 10/233,232.

A Number of Embodiments of the Present Invention

Figures 7A, 7B:
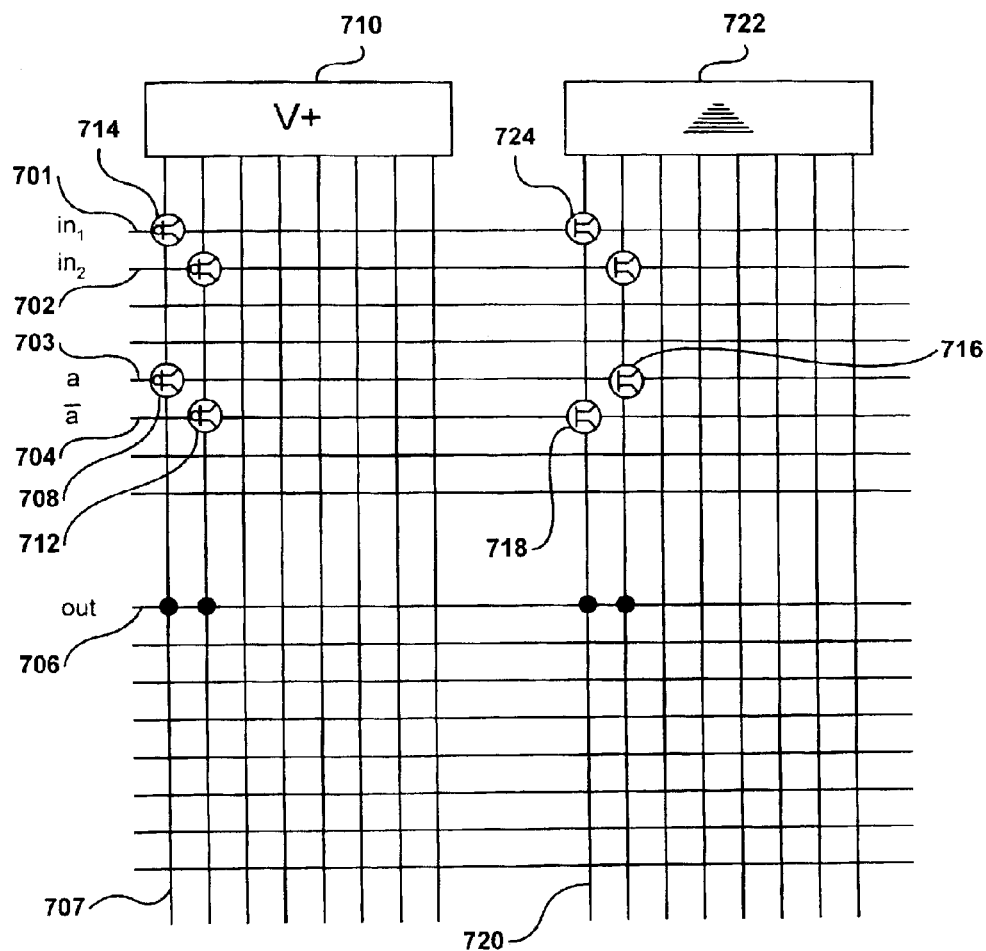
FIGS. 7A–B illustrate implementation of a 2-to-1 multiplexer using a CS lattice similar to the CS lattice described above with reference to FIG. 5.

FIGS. 7A–B illustrate implementation of a 2-to-1 multiplexer using a CS lattice similar to the CS lattice described above with reference to FIG. 5. In FIG. 7A, two input lines, or input nanowires, "$in_1$," and "$in_2$" 701 and 702 are selected by a single-bit, 2-value address input, through an address line "a" 703 and its complement "a" 704, for output to a single molecular output-signal line, or output nanowire 706. FIG. 7B is a truth table indicating the output value based on each of the two possible addresses "0" and "1." When the address line "a" is low, and the complement address line "a" is high, corresponding to the address "0," then the state of input line "$in_1$" 701 is inverted and output to output line 706. Conversely, when the address line "a" is high, and the complement address line "a" is low, corresponding to the address "1," then the state of input line "$in_2$" 702 is inverted and output to output line 706. Thus, FIG. 7A illustrates implementation of a 2-to-1 inverting multiplexer.

Consider, with reference to FIG. 7A, operation of the 2-to-1 multiplexer when the input address is "0." In that case, the state of the input address line "a" 703 is low, or OFF, and the state of the complement address line "a" 704 is high, or ON. In this case, nFET 708 is switched on, interconnecting the output line 706 with a vertical nanowire 707 that serves to interconnect a high voltage source 710 with the output line 706. Conversely, nFET 712 is not active, since complement address line "a" is in a high state, or "1." Note that, although vertical nanowire 707 may potentially interconnect the output line 706 with the high voltage source 710, an additional nFET 714 must be switched on in order to complete the connection. Continuing to the right-hand microregion of the CS lattice, in the case that address "0" is input, pFET 716 is not switched on, since address line "a" 703 is low, while pFET 718 is switched on, since complement address line "a" is high. In this case, vertical nanowire 720 may potentially interconnect output line 706 with ground 722, depending on the state of pFET 724.

When input line "in$_1$" 701 is high, nFET 714 is not activated, and the molecular output-signal line 706 is not connected with the high voltage 710. However, when molecular input-signal line "in$_1$" 701 is high, pFET 724 is activated, shorting the molecular output-signal line 706 to ground 722. Conversely, when molecular input-signal line "in$_1$" 701 is low, nFET 714 is activated and PFET 724 is not activated, resulting in molecular output-signal line 706 being in an ON state. Thus, when the address input is "0," resulting in activation of nFET 708 and pFET 718, the molecular output-signal line has the inverse state of molecular input-signal line "in$_1$" 701. This corresponds to the first row of the truth table shown in FIG. 7B. A similar analysis, when the states of the input address lines "a" and "a" are reversed, results in output, on output nanoscale signal line 706, of the inverse of the state of molecular input-signal line "in$_2$," corresponding to the second row in the truth table shown in FIG. 7B.

Another way to look at the configuration of the electrical components selectively placed in the CS lattice is as follows. The nFETs activated by address lines set to a particular address serve to select a single vertical nanowire that may potentially interconnect the output line with high voltage. Similarly, the pFETs activated by address lines in the state corresponding to the single address serve to select a single, vertical nanowire that may potentially interconnect the molecular output-signal line with ground. The two selected vertical nanowires must then intersect the input line corresponding to the address with an nFET and pFET, respectively. When the selected input line is high, or "1," the pFET is activated and the molecular output-signal line is shorted, or produces a low or "0" output state. Conversely, when the selected molecular input-signal line is low, or "0," then the nFET is activated and the molecular output-signal line is interconnected with a high-voltage source to produce a high output-signal line state. The output-signal represents inversion of the molecular input-signal line selected by the input address.

Figures 8A, 8B:
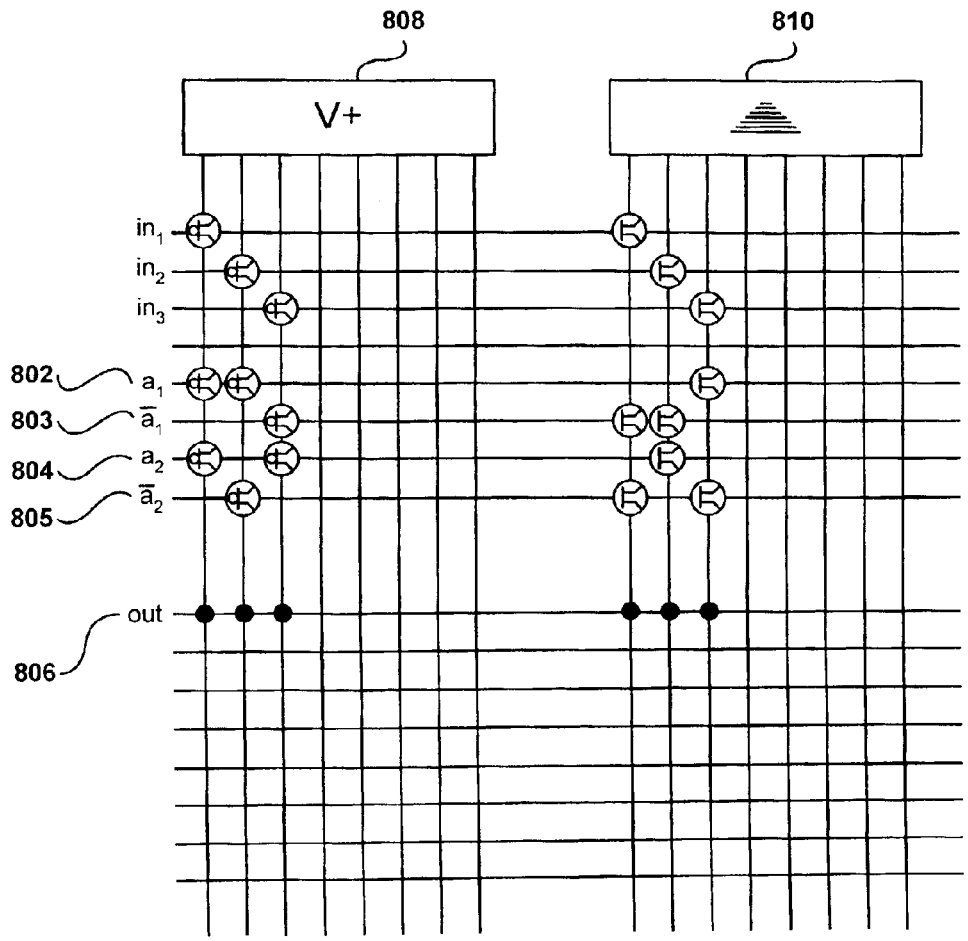
FIGS. 8A and 8B illustrate a 3-to-1 multiplexer implemented using a CS lattice.

FIGS. 8A and 8B illustrate a 3-to-1 multiplexer implemented using a CS lattice. In this case, two address bits are needed in order to encode three different addresses corresponding to the three different input lines. By using two bits, four address values are available. In the implementation shown, one of these addresses is discarded so that, when the discarded address is input through the address lines, the state of the molecular output-signal line is that of high impedance, or high-Z. FIG. 8A shows the nanoscale electrical components, pFETs, nFETs, and connections, selectively formed within the CS lattice, to implement the 3-to-1 multiplexer. FIG. 8B shows a truth table that indicates outputs output by the multiplexer in response to each possible address. The two address bits are encoded in four address lines, with each address bit encoded by the states of a pair of address lines representing an address line and its complement. Thus, the address "00" shown in the first row of the truth table in FIG. 8B corresponds to the address lines "a$_1$" and "a$_2$" being in a low-voltage state, and the complement address lines "$\overline{a}_1$" and "$\overline{a}_2$" being in high-voltage states. Operation of the 3-to-1 multiplexer illustrated in FIGS. 8A–B is similar to that of the 2-to-1 multiplexer, described above with reference to FIGS. 7A–B. Each address, input via address lines 802–805, selects a single vertical nanowire that may potentially interconnect the molecular output-signal line 806 with a high voltage source 808 and a single vertical nanowire that may potentially interconnect the molecular output-signal line 806 with ground 810. The two selected vertical nanowires are interconnected to a single input line through pFET and nFET junction components. As in the 2-to-1 multiplexer, when the selected molecular input-signal line is in a high state, the molecular output-signal line is shorted to ground, and when the selected molecular output-signal line is in a low state, the molecular output-signal line is interconnected with the high voltage source 808. Thus, the 3-to-1 multiplexer inverts the signal of an input line selected by the states of the address lines.

Note that the high-Z state, in addition to the high-voltage state and ground state, provide three distinct, detectable values, allowing the output of the multiplexer to distinguish valid input addresses from invalid addresses. In the 3-to-1 multiplexer, discussed above with reference to FIGS. 8A–B, the addresses "00," "01," and "10" select, for output, the inverse of each of the three input signals "in$_1$," "in$_2$," and "in$_3$." When the invalid input address "11" is input to the 3-to-1 multiplexer, the high-Z state is output, indicating an invalid input address. In many current multiplexers, an invalid input address produces one of two output signals indistinguishable from that produced by a valid input address, namely "0" or "1."

Figures 9A, 9B:
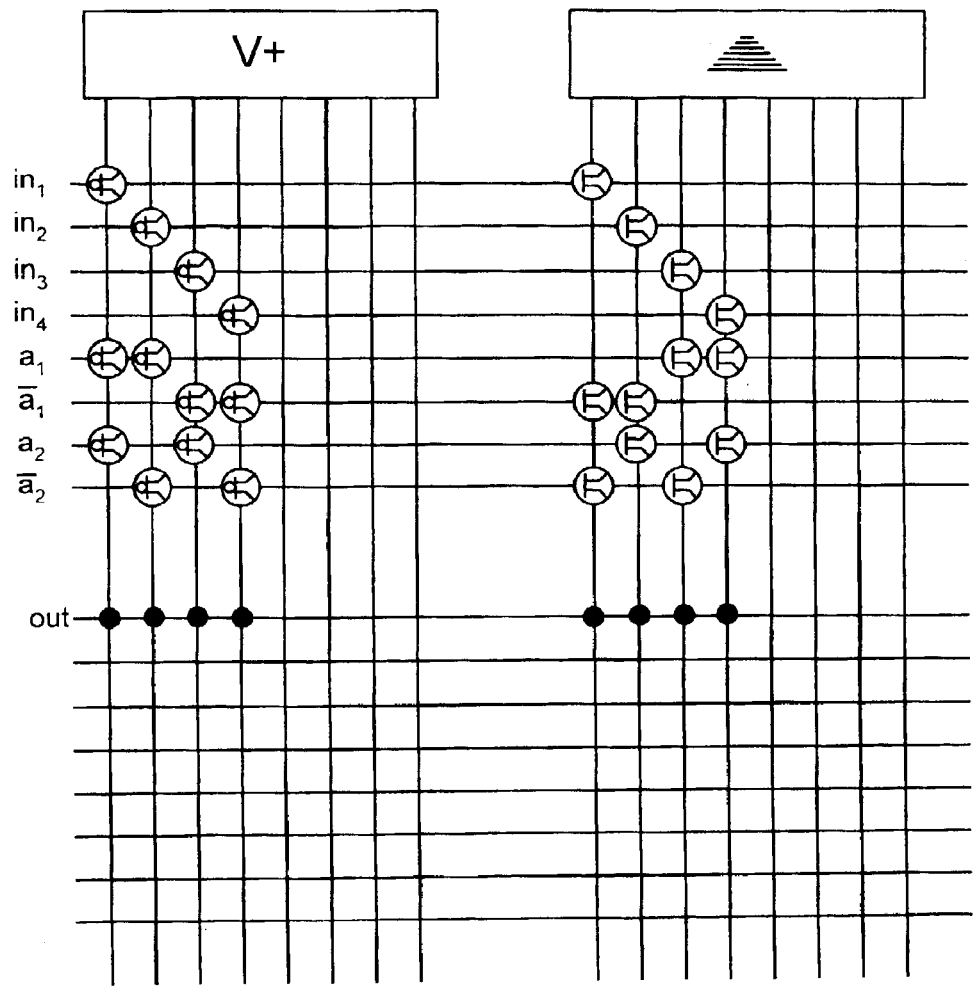
FIGS. 9A and 9B illustrate implementation of a 4-to-1 multiplexer.

FIGS. 9A and 9B illustrate a 4-to-1 multiplexer in the same fashion as the 3-to-1 multiplexer and 2-to-1 multiplexer were illustrated in FIGS. 8A–B and 7A–B, respectively. Because all four addresses are needed for selecting the four molecular input-signal lines, there is no discarded address in the implementation of the 4-to-1 multiplexer shown in FIGS. 9A–B.

Figures 10A, 10B:
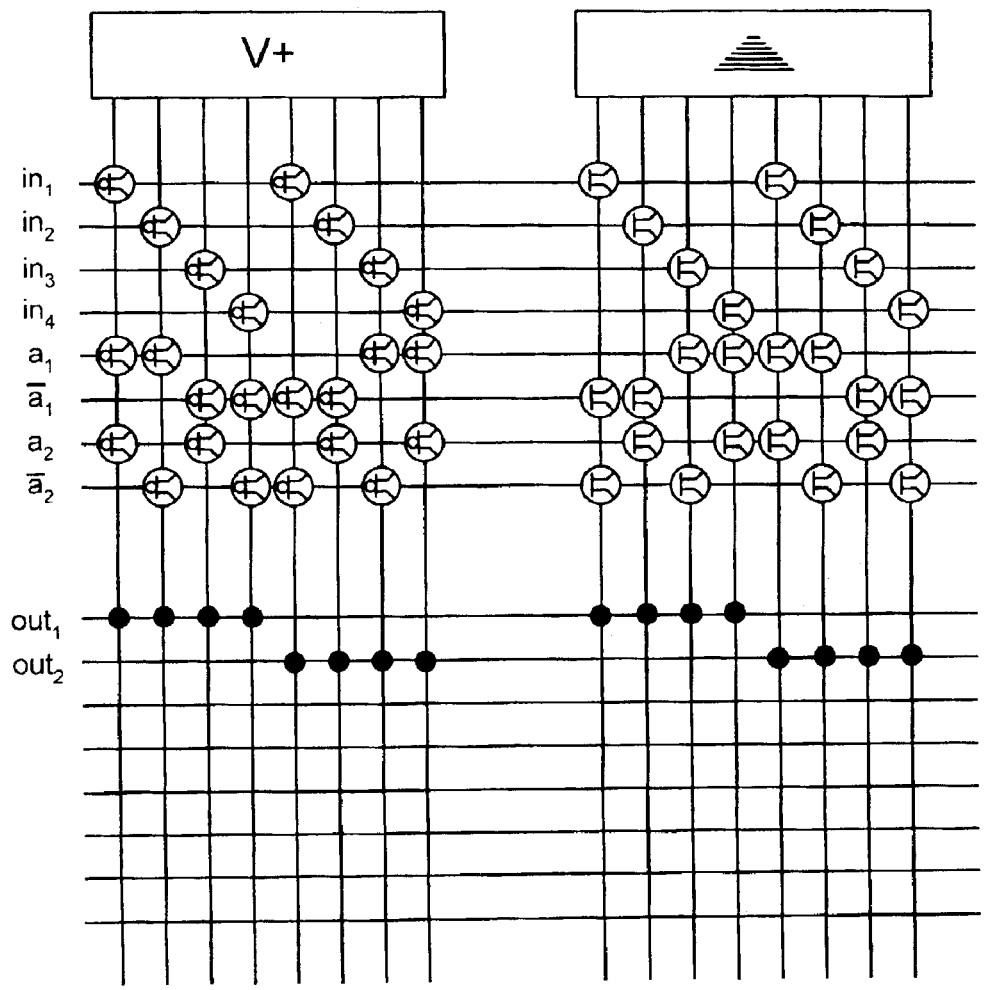
FIGS. 10A–B illustrate implementation of a 4-to-2 multiplexer.
Figures 11A, 11B:
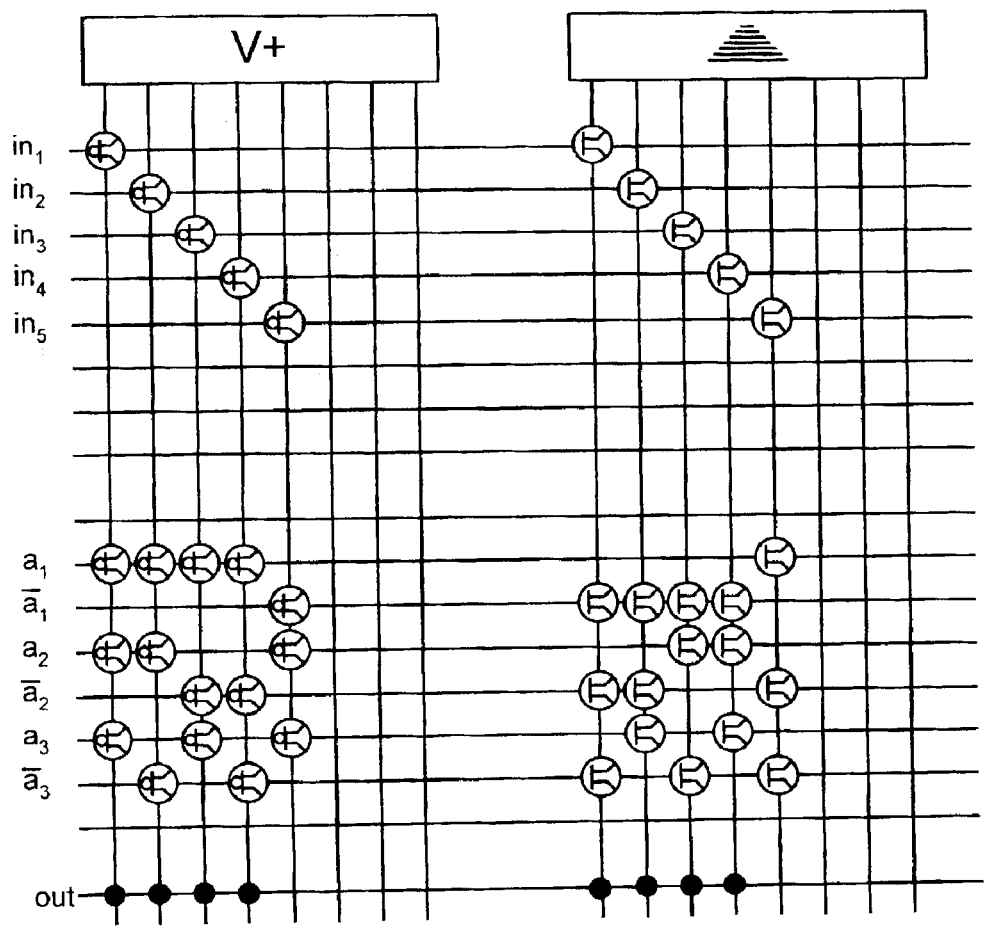
FIGS. 11A–B illustrate a 5-to-1 multiplexer.

It is also possible to construct the general m-to-n multiplexers by the technique discussed with respect to FIGS. 7–9. FIGS. 10A–B illustrate a 4-to-2 multiplexer in which each address input to the multiplexers select two different signal lines for output to two molecular output-signal lines. Again, analysis of the network of selectively configured electronic components within the CS lattice shown in FIG. 10A reveals the identical pattern discussed above, with reference to FIGS. 7–9. Each address, in this case, selects two vertical nanowires that potentially corresponding to arbitrarily selected truth tables. Additional Boolean logic may be included in a multiplexer, by configuring additional junction components, in order to produce desired output signals from input signals. While the above embodiments use a CS lattice with pFET, nFET, and direct interconnection components, with the direct junction components residing in the bottom two quadrants of the CS lattice, nFET components residing in the top, left-hand quadrant of the CS lattice, and pFET components residing in the top, right-hand quadrant of the CS lattice, many different alternative configurations may produce identical output response to the molecular input-signal lines and input address lines. Electrical components other than nFETs and pFETs may be employed, in which case different topologies and configurations may be required to effect each different type of multiplexer. It is possible to invert the sense of the electrical components, to produce inverted outputs. Essentially, a multiplexer defined by any arbitrary truth table describing operation of the multiplexer can be implemented at nanoscale sizes using the method described above.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. An m-to-n nanoscale multiplexer comprising:

m input nanowire signal lines;

n output nanowire signal lines;

a number of input nanowire address lines; and a nanoscale circuit that selects a particular input nanowire signal line for output to each output nanowire signal line based on an address input on the number of input naowire address lines.

2. The m-to-n nanoscale multiplexer of claim 1 implemented in a complementary/symmetry lattice additionally including other nanoscale components that, together with the nanoscale multiplexer, compose an electrical subsystem.

3. The electrical subsystem of claim 2 wherein the nanoscale components are configured together at densities within the electrical subsystem at densities greater than 1.0 giga-transistors/cm$^2$.

4. The m-to-n nanoscale multiplexer of claim 1 wherein the nanoscale circuit comprises pFET, nFET, and interconnection junction components programmed within a molecular-junction-nanowire crossbar.

5. The m-to-n nanoscale multiplexer of claim 4 wherein each input address selects, for each output nanowire signal line a first nanowire, interconnected with an input nanowire signal line by an nFET, interconnected with a high voltage source, and interconnected with the output nanowire signal line; and a second nanowire, interconnected with the input nanowire signal line by a pFET, interconnected with ground, and interconnected with the output nanowire signal line.

6. The m-to-n nanoscale multiplexer of claim 4 wherein the molecular-junction-nanowire crossbar is configured to select a number of input nanowire address lines and output nanowire address lines and produce output signals for each possible input signal according to a truth table.

7. The m-to-n nanoscale multiplexer of claim 1 wherein each input address uniquely selects a single input nanowire signal line, and unused addresses result in undriven output.

8. The m-to-n nanoscale multiplexer of claim 1 wherein microscale non-semiconductive signal lines are used in place of nanoscale non-semiconductive signal lines.

9. A method for configuring an m-to-n nanoscale multiplexer, the method comprising:

providing a complementary/symmetry lattice;

selecting m input nanowire signal lines within the complementary/symmetry lattice;

selecting n output nanowire signal lines within the complementary/symmetry lattice;

selecting a number of input nanowire address lines; and programming junction components within the complementary/symmetry lattice to implement a nanoscale circuit that selects a particular input nanowire signal line for output to each output nanowire signal line based on an address input on the number of input nanowire address lines.

10. The method of claim 9 wherein programming junction components within the complementary/symmetry lattice further comprises:

selectively configuring pFET, NFET, and interconnection electrical components at molecular junction within a molecular-junction-nanowire crossbar.

11. The method of claim 10 further including:

selectively configuring pFETs and nFETs so that each input address selects, for each output nanowire signal line, a first nanowire and a second nanowire.

12. The method of claim 10 further including:

selectively configuring nFETs and pFETs to interconnect, by an NFET, the first nanowire with an input nanowire signal line, with a high voltage source, and with an output nanowire signal line, and to interconnect, by a pFET, the second nanowire with the input nanowire signal line, with ground, and with the output nanowire signal line.

13. An m-to-n nanoscale multiplexer comprising:

m input nanowire signal lines;

n output nanowire signal lines;

a number of input nanowire address lines; and a means for selecting a particular input nanowire signal line for output to each output nanowire signal line based on an address input on the number of input nanowire address lines.

* * * * *